United States Patent
Chiu et al.

(10) Patent No.: US 6,867,084 B1
(45) Date of Patent: Mar. 15, 2005

(54) GATE STRUCTURE AND METHOD OF FORMING THE GATE DIELECTRIC WITH MINI-SPACER

(75) Inventors: Yuan-Hung Chiu, Taipei (TW); Ming-Huan Tsai, Hsinchu (TW); Fang-Cheng Chen, Hsinchu (TW); Hun-Jan Tao, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 14 days.

(21) Appl. No.: 10/263,541

(22) Filed: Oct. 3, 2002

(51) Int. Cl.⁷ .......................................... H01L 21/8238
(52) U.S. Cl. ...................... 438/216; 438/261; 438/591
(58) Field of Search ................................ 438/216, 261, 438/591

(56) References Cited

U.S. PATENT DOCUMENTS

| | | | | |
|---|---|---|---|---|
| 5,275,965 A | * | 1/1994 | Manning | 438/430 |
| 5,410,174 A | * | 4/1995 | Kalnitsky | 257/384 |
| 5,434,093 A | * | 7/1995 | Chau et al. | 438/300 |
| 5,447,874 A | | 9/1995 | Grivna et al. | 437/40 |
| 5,766,998 A | | 6/1998 | Tseng | 438/291 |
| 5,769,679 A | * | 6/1998 | Park et al. | 445/50 |
| 5,940,698 A | | 8/1999 | Gardner et al. | 438/197 |
| 5,960,270 A | | 9/1999 | Misra et al. | 438/197 |
| 6,033,963 A | | 3/2000 | Huang et al. | 438/303 |
| 6,054,355 A | * | 4/2000 | Inumiya et al. | 438/296 |

2002/0179980 A1 * 12/2002 Yagishita et al. .......... 257/384

OTHER PUBLICATIONS

R. Singh et al., "High and Low Dielectric Constant Materials", The Electrochemical Society *Interface*, Summer 1999, pp. 26–30.

"Tutorial—Materials for Thin Films / Microelectronics", 3 pages, www.sigmaaldrich.com/Area_of_Interest/Organic_Inorganic_Chemistry/Materials_Science/Thin_Films_Microelectronics/Tutorial/Dielectric_Materials.html.

* cited by examiner

*Primary Examiner*—Allan R. Wilson
(74) *Attorney, Agent, or Firm*—Haynes and Boone, LLP

(57) ABSTRACT

A field effect transistor gate structure and a method of fabricating the gate structure with a high-k gate dielectric material and high-k spacer are described. A gate pattern or trench is first etched in a dummy organic or inorganic film deposited over a silicon substrate with source/drain regions. A high-k dielectric material liner is then deposited on all exposed surfaces. Excess poly-silicon gate conductor film is then deposited within and over the trench to provide adequate overburden. Poly-silicon is then planarized with chemical mechanical polishing or etch-back methods such that the high-k material film on top of the dummy film surface is removed during this step. In the final step, the dummy film is disposed off, leaving the final transistor gate structure with high-k gate dielectric and high-k spacer surrounding the gate conductor poly-silicon, with the entire gate structure fabricated to form an FET device on a silicon substrate.

22 Claims, 3 Drawing Sheets

GATE STRUCTURE AND METHOD OF FORMING THE GATE DIELECTRIC WITH MINI-SPACER

BACKGROUND OF THE INVENTION (1) Field of the Invention

The present invention relates generally to methods of fabricating a gate dielectric and a mini-spacer, and more particularly, to methods of patterning gate structures with high-k gate dielectric films and mini-spacers in the fabrication of semiconductor devices and integrated circuits.

(2) Description of the Prior Art

The current generation ultra large-scale integrated (ULSI) circuits use predominantly field effect transistor (FET) devices, having poly-silicon gate electrode, silicon dioxide gate dielectric, and self-aligned source/drain regions. Typical process of fabricating an FET consists of growing a thin gate silicon dioxide on a silicon substrate and then forming the poly-silicon gate electrode. Source/drain (S/D) regions are then formed adjacent to the gate electrode, which then defines the FET gate length as the distance under the poly-silicon gate between the S/D regions. The gate length and the control of gate length is critical, particularly as channel lengths continue to decrease to achieve high device densities, since short channel effects (SCE) can occur in the device. SCE effects become predominant since band-gap and junction potentials cannot be scaled with channel length, being dependent on the substrate material (i.e. silicon).

Fabrication of the gate electrode structure is critical in achieving optimum performance of the MOSFFT (metal-oxide-silicon field effect transistor) device. The gate stack, consisting of the gate electrode and the gate dielectric, essentially determines the operating speed and reliability of the device.

Although silicon dioxide has been the dielectric of choice for many years because of ease of forming the film and patterning it, high-k refractory metal oxides are being increasingly experimented in recent years. The motivation is that high-k gate dielectric films reduce the equivalent gate oxide thickness between the gate metal and the substrate, thereby increasing device performance. If silicon dioxide has to be used in ULSI devices with short channel length, it needs to be quite thin to achieve large capacitance values and formation of nanometer range, high quality oxides without defects is quite difficult if not impossible. Several gate structures with high-k gate dielectric have been proposed in prior art. However, patterning of high-k films, unlike the conventional silicon oxides or nitrided oxides, is difficult for two main reasons: i) plasma etching of these films that do not easily form volatile reaction products requires high self-developed or applied bias voltages will cause device damage of the silicon surface of the transistor and ii) alternatively, non damaging wet etching processes result in poor dimensional control of the FET channel length and are prone to etch residues that are hard to remove during post-processing steps.

U.S. Pat. No. 5,447,874 describes a method of producing devices with improved gate length control, eliminating contamination induced surface damage, leakage problems without increasing processing steps. A gate opening is anisotropically etched in an oxide layer, creating a reverse gate metal image that has low gate length variability. Dual metal gate is then deposited and the excess gate metal is removed and the top surface of the gate planarized using chemical mechanical polishing. The remaining oxide is then removed. The patent refers to a dual metal gate with a conventional silicon dioxide gate dielectric film.

In U.S. Pat. No. 5,940,698, a device with a high performance gate structure and a fabrication process is described. According to the process disclosed, a gate insulating film is deposited over a substrate, a diffusion barrier layer is then formed over the gate-insulating layer, and a trench is etched in the diffusion barrier layer. In the trench, a metal gate electrode is formed. Although the high-k materials like cobalt niobate, barium strontium nitrate (BST), and tantalum oxide are proposed, the process described is quite complex and it is very likely that etch residues will be left on the silicon substrate when etching the high-k film within the gate trenches and around the gate structure, as previously discussed.

U.S. Pat. No. 5,960,270 describes a process of forming a metal-gate/metal-oxide/semiconductor MOS transistor with self-aligned source and drain electrodes formed before defining the metal gate. Although high-k metal oxides like $TiO_2$ and $Ta_2O_5$ are mentioned as a part of a composite dielectric gate (e.g. grown oxide/deposited high-k material), no specific process is described or taught on how to pattern high-k films without the problems associated with post-etch residues.

U.S. Pat. No. 5,766,998 describes a method of forming reverse self-aligned FETs (field effect transistors) with gate electrode of sub-quarter micrometer dimensions that exceed the lithographic resolution limit with the use of polymer sidewall spacers. The process described includes forming a stack of titanium layer, and $N^+$ doped first poly-silicon layer, and a silicon nitride layer over the device regions. Non-volatile polymer sidewall spacers are then formed on the sidewalls of the first openings. The sidewalls and the photo-resist together act as a mask for selectively etching the said stack down to the substrate and form the second opening to define the FET channel. A gate oxide is grown on the substrate in the channel opening. The gate dielectric film is a conventional silicon dioxide grown by thermal oxidation.

In U.S. Pat. No. 6,033,963, a method is described to form a metal gate for a CMOS device, using a replacement gate process. According to the process, a dummy gate oxide and a poly-silicon gate electrode layer are formed and patterned to forma a dummy gate. Lightly doped source and drain regions are formed using dummy gate as implant mask. After forming sidewall spacers, source and drain regions are formed and annealed. Tungsten layer is then selectively deposited on the exposed silicon surfaces. Blanket dielectric layer is then deposited and planarized, stopping on the tungsten layer. The tungsten overlying the dummy gate are removed, thereby forming a gate opening. A gate oxide layer and a metal gate electrode layer are then deposited in the gate opening and planarized, stopping on the blanket oxide layer. The structure uses a conventional oxide as the gate dielectric.

SUMMARY OF THE INVENTION

Accordingly, it is a primary object of the invention to describe a simple method to form a gate structure with high-k dielectric gate and mini-spacer surrounding the gate.

Another object of the invention is to describe a gate structure with high-k gate dielectric and high-k mini-spacer as an integral part of the device.

It is yet another object of the invention to describe a damage-free and residue-free process for forming a high-k gate dielectric and simultaneously form high-k mini-spacer as part of the gate forming process.

Yet another object of the invention is to describe a process for forming high-k gate dielectric and mini spacer structure, using a disposable dummy trench structure.

A further object of the invention is to provide an FET device with a gate structure having a high-k gate dielectric with improved control of gate length and an integral mini-spacer.

In accordance with these objectives, a method is described to fabricate a gate structure with high-k dielectric material, a mini-spacer of the same high-k material, and improved gate length. The high-k gate film is patterned damage-free and without leaving any process residues. A trench pattern is formed in a disposable dummy film that is deposited over a silicon substrate. A high-k dielectric film liner is then deposited within said trench pattern. The trench, with high-k film as the liner, is then filled with poly-silicon gate conductor. The structure is then planarized preferably using chemical mechanical polishing method or other etch-back processes, such that said high-k film on the planar surfaces of the dummy film is also removed during the planarizing step, thereby leaving the high-k film liner only inside the trenches. The dummy film around the gate is then removed to leave a structure with mini-spacer of high-k material surrounding the gate. Because the process uses a deposition method to form the high-k gate structure within a dummy trench, the gate length is much more precisely defined as compared to methods using etching process to pattern high-k gate.

BRIEF DESCRIPTION OF THE DRAWINGS

The objects, advantages, and details of fabricating a semiconductor device according to this invention will be more clearly understood from the following detailed description taken in conjunction with the accompanying drawings

DESCRIPTION OF THE PREFERRED EMBODIMENTS

The process described in the present invention provides a simplified method to fabricate a gate structure in an FET semiconductor device with a high-k gate dielectric and a mini-spacer, without producing any device damage or leaving any process residues. Although in the present invention a dummy trench is etched in nitride or organic BARC film, any material that can be easily patterned using conventional wet or plasma etching process can be used.

Figure 1:
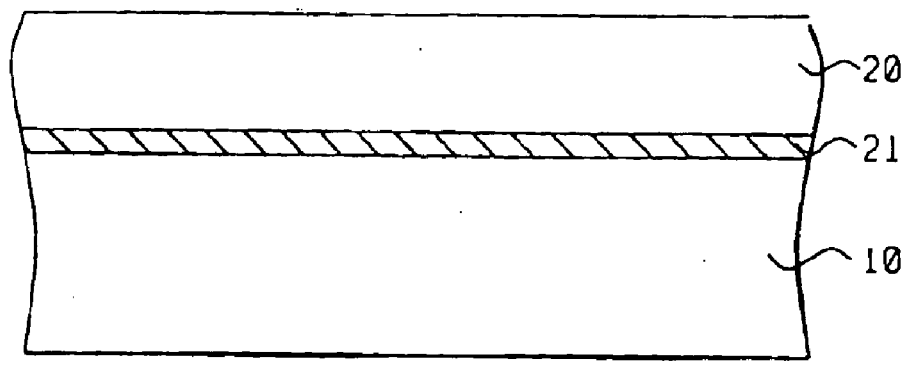
FIG. 1 is a cross-sectional view of the invention, showing a dummy film and oxide film deposited over a silicon substrate.

Referring now to FIG. 1, there is shown a substrate 10 that is silicon of desired crystallographic orientation in this embodiment having other parts of the FET device already formed (not shown) in it. A disposable dummy film 20, is then deposited over substrate 10 using standard deposition methods such as: chemical vapor deposition (CVD), plasma enhanced CVD (PE-CVD), or spin coating known in prior art. The dummy film can be of inorganic type selected from a group of inorganic materials comprising silicon nitride, silicon oxy-nitride, silicon dioxide, inorganic arc film, amorphous silicon, doped or un-doped poly-silicon, silicon-germanium; or of organic type selected from a group of materials comprising resist, organic anti-reflection film, a polymer, and polyimide. If silicon nitride is used as the dummy film of choice to form the trenches in, a thin silicon dioxide film 21 is first deposited over substrate 10 to reduce the stress created by the thick silicon nitride film. The dummy film thickness is kept approximately at the thickness of the gate structure, of between about 1000–5000°A. Thickness of silicon dioxide used to reduce the stress of nitride film is normally in the range of about 50–150°A.

Figure 2:
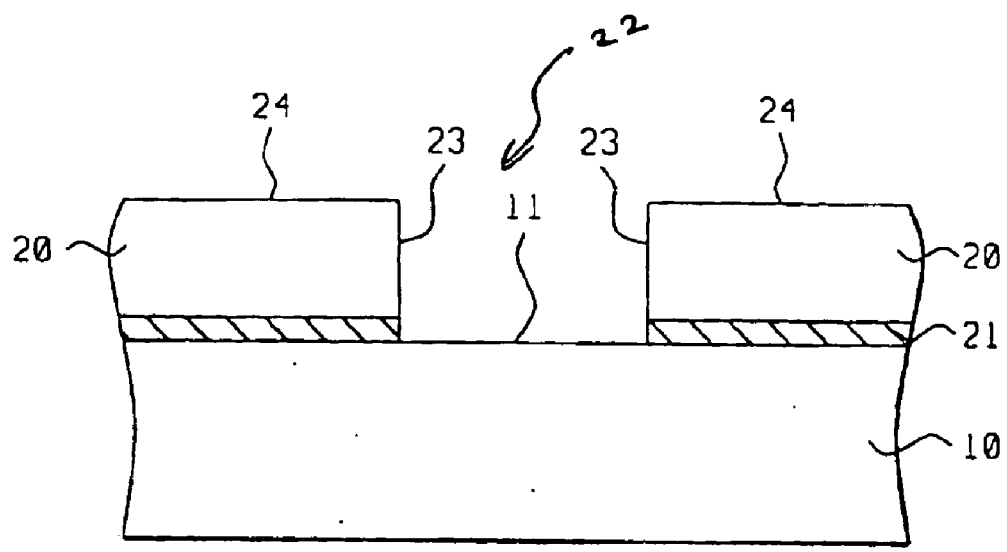
FIG. 2 is a cross-sectional view of the invention showing the patterned dummy trench etched in dummy film and oxide film.

Referring now to FIG. 2, there is shown a trench pattern 22 etched in the dummy films 20 and 21, using standard lithographic techniques and plasma etching process well known in prior art. A photo-resist mask is first formed (not shown) over the dummy film and the trench pattern formed using a selective plasma etching process such that etching stops on the substrate surface 11. If an inorganic film is used as the dummy film, the etching process typically uses gaseous plasma containing predominantly fluorine species. Examples of such gases are: $CF_4$, $CHF_3$, $C_2F_6$, $C_4F_8$, $NF_3$, $SF_6$. If organic type films are used, the etching process uses gaseous plasma containing predominantly oxygen species. Examples of these gases are: $O_2$, $NO_2$, $CO_2$.

Figure 3:
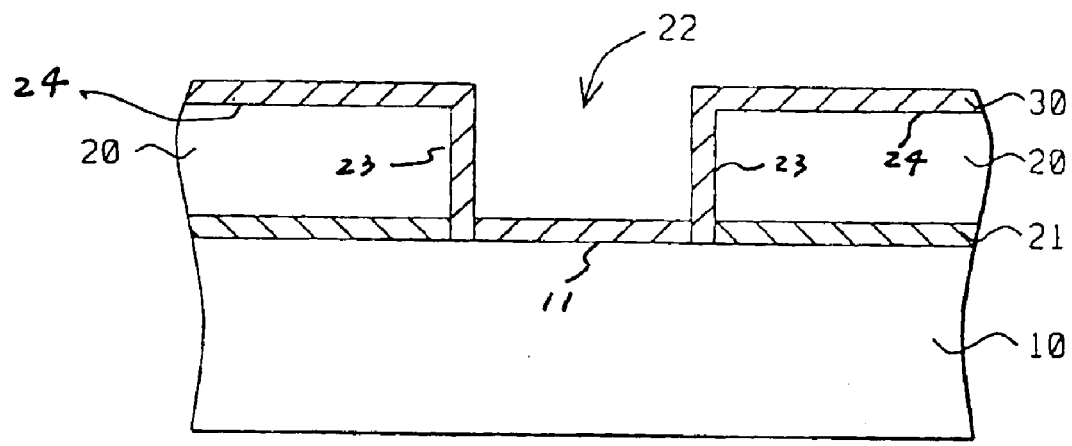
FIG. 3 is a cross-sectional view of the invention showing the trench pattern with a high-k dielectric film deposited on all exposed surfaces.

Referring now to FIG. 3, there is shown said trench pattern 22 with high-k gate dielectric film 30 deposited on all of the exposed surfaces. The film 30 is selected from a group of materials comprising $Zr_xO_y$, $Hf_xO_y$, $Ta_xO_y$, $Ti_xO_y$, $Al_xO_y$, $Hf_xSi_yO_z$, and/or $Zr_xSi_yO_z$. Alternatively, the film 30 may also be selected from a groups of materials comprising silicon dioxide, silicon dioxide nitrided by decoupled plasma or nitridation process, silicon nitride, and/or silicon oxy-nitride. The film 30, equal to the equivalent gate oxide (thickness of about 20–100°A, is then deposited using chemical vapor deposition processes or other deposition methods such as sputter deposition, known in prior art such that conformal deposition takes place. Conformal deposition implies near-equal thickness of the film on vertical planes 23, horizontal planes 24, and surfaces 11. Although in the preferred embodiment, a conformal film of dielectric material is used, the film can also be deposited in a partially conformal manner (i.e. thickness on all the surfaces is not equal) as long as the film adequately covers the step of the gate trench pattern.

Figure 4:
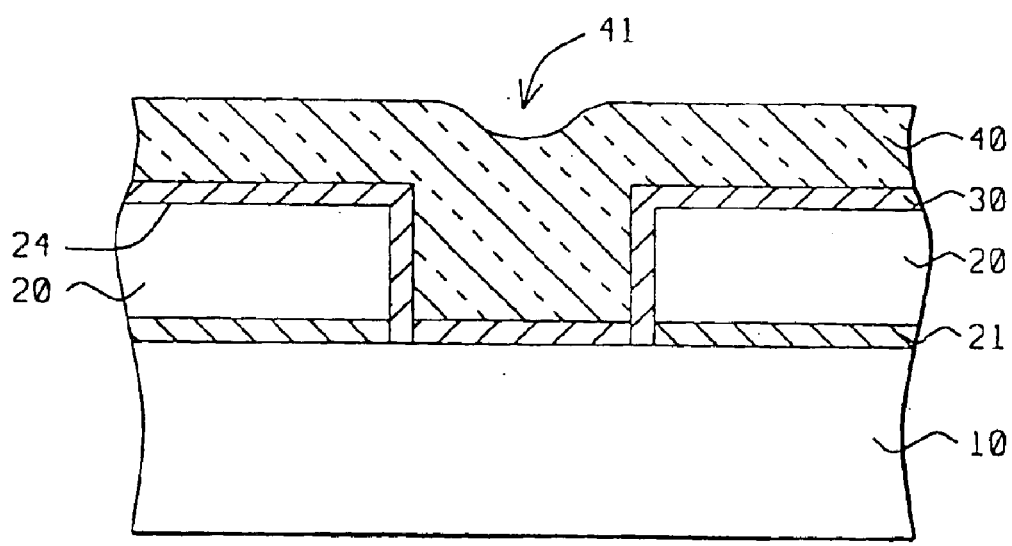
FIG. 4 is a cross-sectional view of the invention showing a structure wherein the trench pattern is filled with poly silicon which also shows a dimple over the trench.

Referring now to FIG. 4, there is shown said trench pattern 22 with the preferred doped poly silicon gate conductor material 40 deposited inside the trench 22 and over the entire planar surface. The poly-silicon thickness is so adjusted as to achieve adequate overburden so that the whole wafer is covered with poly-silicon and the dimples 41 over the trench patterns are well above the plan of the high-k film 30 on surface 24. The thickness of poly-silicon 40 is normally greater than about 2000°A. Although doped poly-silicon is used as the gate conductor in the preferred embodiment, other silicon-based materials selected from the group comprising single crystal silicon, poly silicon, doped silicon, doped poly-silicon, amorphous silicon, and/or silicon-germanium and metal-based gate conductors such as, tungsten, tungsten nitride, aluminum, $Ti_xN_y$, $Ta_xN_y$, copper, $WSi_x$, and $CoSi_x$, can be successfully used.

Figure 5:
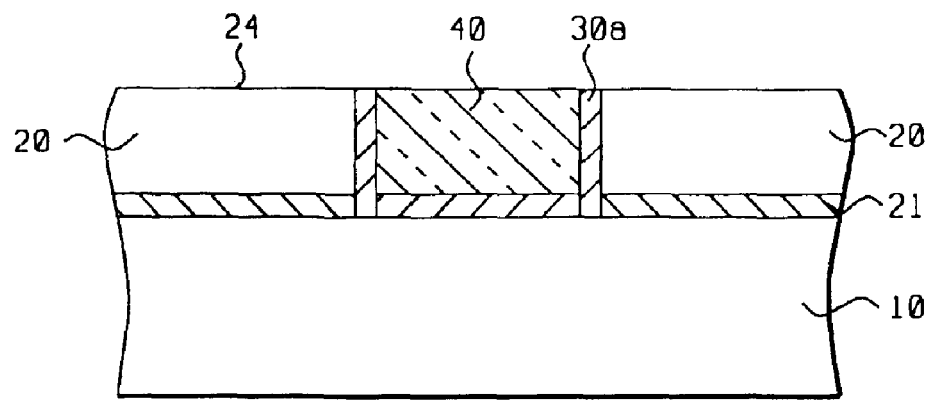
FIG. 5 is a cross-sectional view of the invention showing the wafer after planarizing the poly-silicon and with high-k film removed from dummy film surface.

Referring now to FIG. 5, there is shown the partial structure after the poly-silicon over the trench pattern has been planarized, preferably using chemical mechanical planarization (CMP) or plasma etch back processes well known in prior art. Planarization is done such that the high-k film on the horizontal surface 24 of the dummy film 20 is completely removed during this step. Incomplete removal of high-k film 30 or residues left on surface 24 transfer themselves on the substrate and result in process residues when the dummy film is tripped off in a later and final step.

Figure 6:
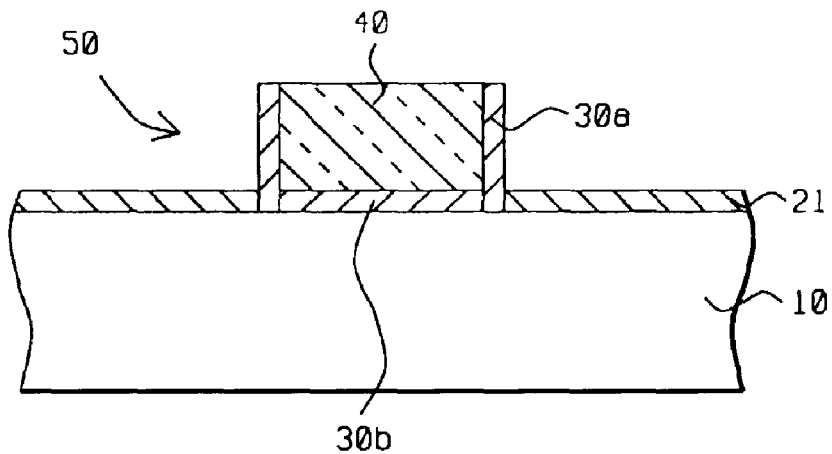
FIG. 6 is a cross-sectional view of the invention showing the final gate structure after the dummy film has been removed. The entire gate structure shows the poly gate conductor, high-k mini spacer, and high-k gate dielectric.

Referring now to FIG. 6, there is shown the final gate structure 50 after the dummy film 20 adjacent to the gate structure has been stripped off using plasma or wet etching process. When the dummy film 20 is of the inorganic type, wet or suitable plasma etching processes selective to the substrate 10 are used. When the dummy film 20 is of the organic type, organic solvent strip or suitable ashing processes such as oxygen plasma, UV/ozone, or microwave plasma are used. The final structure 50 in FIG. 6, shows the gate conductor of poly silicon 40, high-k gate dielectric 30b and high-k mini-spacer 30a surrounding the gate conductor 40, with the entire gate structure fabricated on silicon substrate 10.

Figure 7:
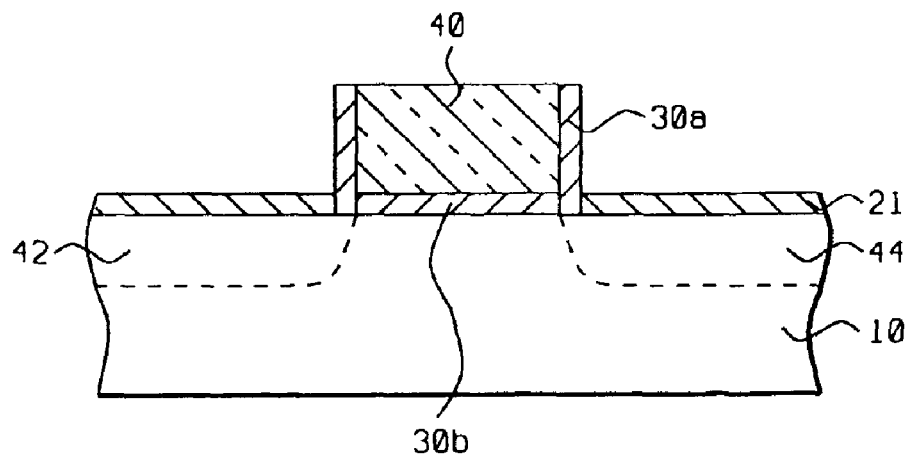
FIG. 7 is a cross-sectional view of an FET device showing source/drain regions and the high-k gate structure and mini-spacers of the invention.

FIG. 7 shows the FET device, showing the source 42 and drain 44 regions and the gate structure of the invention: high-k gate dielectric 30b, poly-silicon gate conductor 40, and high-k mini-spacer 30a.

The advantages of the aforementioned invention are:
a) A gate structure is formed with high-k gate dielectric and high-k mini spacer, both formed simultaneously without the use of additional steps.
b) A non-etching process is used for forming the high-k gate dielectric pattern and the mini-spacers, thereby not producing any etch residues.
c) High-k gate structure is patterned without any etch damage since plasma etching, which is inherently prone to producing device damage, is not directly used to etch the high-k film. Only the dummy film patterning uses the plasma etching process.
d) High-k gate pattern is formed by a deposition process and not by plasma etching.

While the invention has been particularly shown and described with reference to the preferred embodiment thereof, it will be understood by those skilled in the art that various changes in form and details may be made without departing from the concept, spirit, and the scope of the invention.

What is claimed is:

1. A method of forming a gate structure comprising the steps of:
   forming a dummy film over a substrate,
   forming a trench pattern in said dummy film,
   depositing a liner having a dielectric constant (k) larger than 7 on all surfaces of said trench pattern to form a gate dielectric and gate spacers,
   filling said trench pattern with gate conductor material,
   removing said gate conductor material and a portion of said liner to level off said gate conductor material with said dummy film, and
   removing said dummy film from around said trench pattern,
   wherein said dummy film is selected from the group comprising photo-resist, polyimide, polymers, and organic arc.

2. The method according to claim 1, wherein said high-k material liner is selected from the group comprising $Zr_xO_y$, $Hf_xO_y$, $Ta_xO_y$, $Ti_xO_y$, $Al_xO_y$, $Hf_xSi_yO_z$, and $Zr_xSi_yO_z$.

3. The method according to claim 1, wherein said high-k material liner is deposited over said trench pattern in a fully conformal manner or in a partially conformal manner.

4. The method according to claim 1, wherein said gate conductor is composed of silicon-based material.

5. The method according to claim 4, wherein said silicon-based gate conductor is selected from the group comprising single crystal silicon, poly silicon, doped silicon, doped poly silicon, amorphous silicon, and silicon-germanium.

6. The method according to claim 1, wherein said gate conductor is composed of metal-based material.

7. The method according to claim 6, wherein said metal-based gate conductor is selected from the group comprising tungsten, tungsten nitride, aluminum, $Ti_xN_y$, $Ta_xN_y$, copper, $WSi_x$, and $CoSi_x$.

8. The method according to claim 1, wherein forming a dummy film over a substrate comprises depositing said dummy film by a chemical vapor deposition (CVD) process.

9. The method according to claim 1, wherein forming a trench pattern comprises etching using gaseous plasma selected from the group consisting of $O_2$, $NO_2$, $CO_2$, or a combination thereof.

10. The method according to claim 1, wherein said liner has a thickness ranging from about 50 Angstrom to about 200 Angstrom.

11. The method according to claim 1, wherein depositing a liner comprises a CVD process.

12. The method according to claim 1, wherein removing said gate conductor material and a portion of said liner comprises a chemical mechanical planarization (CMP) process.

13. The method according to claim 1 wherein the liner has a dielectric constant between about 20–30.

14. The method according to claim 1 wherein the liner has a dielectric constant between about 50–80.

15. The method according to claim 1 wherein the liner has a dielectric constant between about 7–20.

16. A method of forming a gate structure comprising the steps of:
   forming a dummy film over a substrate,
   forming a trench pattern in said dummy film,
   depositing a liner having a dielectric constant (k) larger than 7 on all surfaces of said trench pattern to form a gate dielectric and gate spacers,
   filling said trench pattern with gate conductor material,
   removing said gate conductor material and a portion of said liner to level off said gate conductor material with said dummy film, and
   removing said dummy film from around said trench pattern,
   wherein removing said gate conductor material and said liner comprises performing a plasma etch back process.

17. A method of forming a gate structure comprising the steps of:
   forming a dummy film over a substrate,
   forming a trench pattern in said dummy film,
   depositing a liner having a dielectric constant (k) larger than 7 on all surfaces of said trench pattern to form a gate dielectric and gate spacers, filling said trench pattern with gate conductor material, removing said gate conductor material and a portion of said liner to level off said gate conductor material with said dummy film, and removing said dummy film from around said trench pattern, wherein forming a dummy film over a substrate comprises depositing said dummy film by a spin coating process.

18. A method of forming a gate structure comprising the steps of:

forming a dummy film over a substrate, forming a trench pattern in said dummy film, depositing a liner having a dielectric constant (k) larger than 7 on all surfaces of said trench pattern to form a gate dielectric and gate spacers, filling said trench pattern with gate conductor material, removing said gate conductor material and a portion of said liner to level off said gate conductor material with said dummy film, and removing said dummy film from around said trench pattern, wherein said dummy film is selected from the group comprising silicon nitride, silicon oxy-nitride, oxide, inorganic arc film, amorphous silicon, doped or un-doped poly-silicon, and silicon-germanium, and wherein forming a trench pattern comprises etching using gaseous plasma selected from the group consisting of $CF_4$, C2F6, $C_4F_8$, $NF_3$, $SF_6$, or a combination thereof.

19. A method of forming a gate structure comprising the steps of:

forming a dummy film over a substrate, forming a trench pattern in said dummy film, depositing a liner having a dielectric constant (k) larger than 7 on all surfaces of said trench pattern to form a gate dielectric and gate spacers, filling said trench pattern with gate conductor material, removing said gate conductor material and a portion of said liner to level off said gate conductor material with said dummy film, and removing said dummy film from around said trench pattern, wherein depositing a liner comprises a sputtering process.

20. A method of forming gate structure comprising the steps of:

forming a dummy film overlying a substrate, forming a trench pattern in said dummy film to expose a trench surface of said substrate and a sidewall portion of said dummy film, forming a liner of a dielectric constant larger than 7 overlying a top surface of said dummy film, sidewall portions of said dummy film and a trench surface of said substrate, forming a gate conductive material overlying said liner to fill said trench pattern, removing at least a portion of said gate conductor material and said liner around said trench pattern, wherein said liner remains overlying said sidewall portion of said dummy film and said trench surface of said substrate, and removing said dummy film.

21. A method of forming gate structure comprising the steps of:

forming a dummy film overlying a substrate, forming a trench pattern in said dummy film to expose a trench surface of said substrate, forming a dielectric liner on surfaces of said trench pattern to form a gate dielectric and gate spacers, wherein the dielectric liner has a dielectric constant (k) greater than 7, forming a gate conductive material overlying said liner to fill said trench pattern, removing a portion of said gate conductor material and said dielectric liner above a top surface of said dummy film, and removing said dummy film.

22. The method according to claim 21, wherein said dummy film is selected from the group comprising silicon nitride, silicon oxy-nitride, oxide, inorganic arc film, amorphous silicon, doped or un-doped poly-silicon, and silicon-germanium.

* * * * *